CONVERTER STAGE IN WHICH OSCILLATOR TUNED CIRCUIT ALSO SERVES AS OUTPUT LOAD IMPEDANCE FOR RF STAGE
Filed Oct. 30, 1963
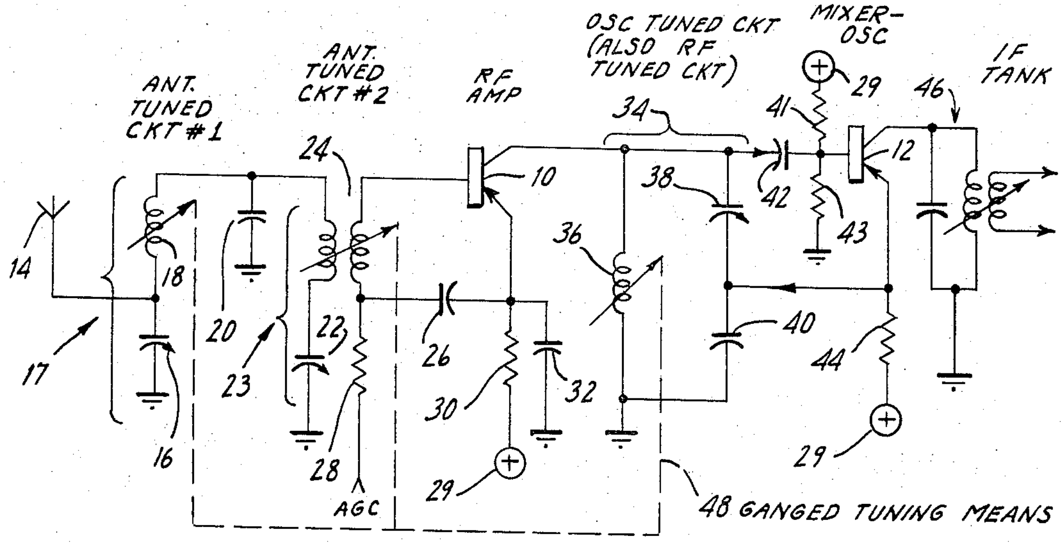
FIG. 1. FRONT END CIRCUITRY OF RECEIVER, COLPITTS LOCAL OSCILLATOR
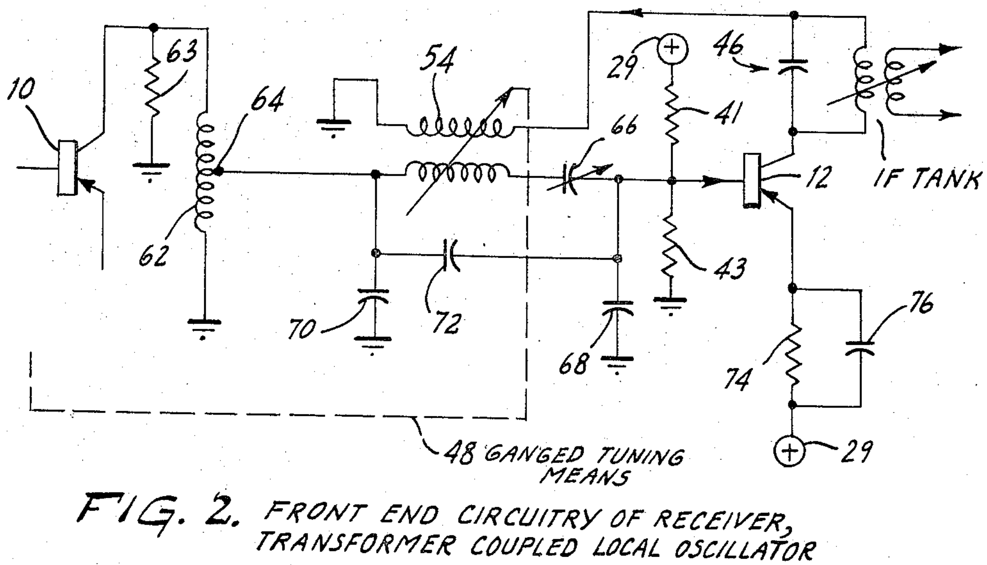
FIG. 2. FRONT END CIRCUITRY OF RECEIVER, TRANSFORMER COUPLED LOCAL OSCILLATOR
INVENTORS
JOHN F. BERES
RALPH BRAY
BY
D R Pressman
ATTORNEY United States Patent Office 3,350,648

Patented Oct. 31, 1967

3,350,648

CONVERTER STAGE IN WHICH OSCILLATOR TUNED CIRCUIT ALSO SERVES AS OUTPUT LOAD IMPEDANCE FOR RF STAGE

John F. Beres, Southampton, and Ralph Bray, Philadelphia, Pa., assignors to Philco-Ford Corporation, a corporation of Delaware Filed Oct. 30, 1963, Ser. No. 320,094
5 Claims. (Cl. 325—440)

ABSTRACT OF THE DISCLOSURE

Front end for transistorized receiver in which the tunable circuit of the converter stage also serves as a quasi-tuned circuit for the radio frequency amplifier stage.

This invention relates to receivers, and, in particular, to improvements in tuned circuits for use in the "front end" (radio frequency and mixer stages) of transistor receivers.

The conventional superheterodyne transistor receiver usually contains a stage to amplify the radio frequency energy received by the antenna, and a stage to convert the amplified radio frequency energy to an intermediate frequency. Such a receiver usually includes four resonant circuits which must be ganged together and tuned in unison when the receiver is tuned.

Two of the tunable resonant circuits are required between the antenna and the radio frequency amplifier in order to obviate intermodulation effects to which transistors are peculiarly susceptible due to their inherently nonlinear input characteristics. The third of the tunable resonant circuits is used as the load in the output circuit of the radio frequency amplifier to obviate harmonics produced when strong input signals drive the radio frequency amplifier into its nonlinear region. These harmonics may mix with the received signal and cause undesirable tweets to be heard. The fourth tunable resonant circuit is found in the oscillator-converter stage. As is well known, adjustment of this circuit changes the frequency of the local oscillator and hence the tuning of the receiver. The first three circuits are tuned to the frequency of the desired radio frequency signal, while the fourth is tuned to the oscillator frequency which always is separated from the incoming signal by an amount equal to the intermediate frequency.

Four tunable circuits add obvious disadvantages of cost and weight to a receiver. In addition, it is often difficult to maintain the constant frequency interrelationships which are required as all four circuits are tuned in unison throughout their range.

Heretofore these problems have been partially obviated by replacing the third tunable circuit in the output of the radio frequency amplifier with a nontunable broadband circuit arranged to pass all the frequencies receivable by the set. This has eliminated some of the difficulties encountered with four tunable circuits, but has not adequately solved the problem of tweets produced by harmonics generated when strong signals were received. This is because the frequencies of some lower-order generated harmonics lie within the bandpass of the broadband tuned circuit, and hence cannot be blocked by said broadband circuit.

It would thus be desirable if means were available to obtain the advantages of a narrow band tunable circuit in the output of the radio frequency amplifier without the aforediscussed disadvantages concomitant to the utilization of four tunable circuits or the alternative solution provided by use of a broadband load for the third tunable circuit.

*Objects*

Accordingly, several objects of the present invention are:

(1) To reduce the number of tunable circuits required in a transistor receiver.

(2) To obivate the requirement for a separate tunable circuit in the output of the radio frequency stage.

(3) To simplify, reduce the cost, and improve the performance of transistor receivers.

(4) To reduce the problem of audible tweets caused by harmonics generated when strong signals are received in transistor receivers.

Other objects and advantages of the invention will become apparent from a consideration of the ensuing description thereof.

*Summary*

According to one embodiment of the present invention, the load of the radio frequency amplifier is a narrow band tunable circuit which is also made to double as the tunable circuit of the oscillator-mixer stage. This circuit is tuned to the oscillator frequency which is close to the frequency of the received signal and thus provides an effective radio frequency filter.

*Drawing*

FIG. 1 shows the front end circuitry of a receiver according to the invention wherein is used a Colpitts oscillator in the mixer stage.

FIG. 2 shows a system similar to FIG. 1, but wherein a transformer feedback oscillator is used.

FIG. 1.—RECEIVER CIRCUIT WITH COLPITTS LOCAL OSCILLATOR

*Description*

The radio frequency amplifier and converter stages of a transistor receiver according to the invention are shown in FIG. 1. Transistor 10 is part of the radio frequency amplifier stage, and transistor 12 is part of the mixer-oscillator stage.

Modulated radio frequency energy is received by antenna 14 and fed to resonant circuit 17 which includes adjustable capacitor 16 and adjustable inductor 18. Therefrom it is coupled across capacitor 20 and fed to the series resonant circuit 23 which includes adjustable capacitor 22 and the primary winding of adjustable impedance transformer 24. One terminal of the secondary winding of transformer 24 is directly coupled to the base of transistor 10, and the other terminal is coupled to the emitter of transistor 10 for RF signals via capacitor 26. An AGC signal is fed back from later stages of the receiver (not shown) to the base of transistor 10 via resistor 28 and the secondary of transformer 24.

The emitter of transistor 10 is biased from source 29 via resistor 30 which is bypassed by capacitor 32. The collector load circuit of transistor 10 consists of tunable circuit 34 which includes adjustable inductor 36, adjustable capacitor 38, and fixed capacitor 40.

Circuit 34 is also the tunable circuit for the oscillator-mixer stage including transistor 12. Circuit 34 is tuned to the oscillator frequency, which is equal to the frequency of the incoming carrier plus the particular intermediate frequency to be used. The emitter of transistor 12 is coupled to the junction of capacitors 38 and 40 while the opposite terminal of capacitor 38 is connected to the base of transistor 12 via capacitor 42. Bias for transistor 12 is supplied to its emiter from source 29 via resistor 44.

The collector lead impedance for transistor 12 consists of transformer circuit 46, which is tuned to the intermediate frequency. The base of transistor 12 is also biased to a proper potential by the voltage divider including resistors 41 and 43 which are connected between source 29 and ground. The tuning of inductors 18, 36, and transformer 24 is ganged and the mechanism for such synchronous tuning is indicated generally by the dashed line 48. Thus the two tunable antenna circuits will always be tuned to identical frequencies as their resonant frequencies are adjusted, while tunable circuit 34 will always be tuned to a frequency larger than the frequency of the tunable antenna circuits by the intermediate frequency. The other adjustable components shown in the drawing are manually adjustable for purposes of alignment.

*Operation*

Assume that the two tunable antenna circuits 17 and 23 are properly tuned to a like frequency and tunable circuit 34 is tuned to a frequency greater than the former by the intermediate frequency to which circuit 46 is tuned.

Radio frequency energy received by antenna 14 which is of the frequency of the antenna tuned circuits will be coupled across the base-emitter circuit for transistor 10 via a far lower impedance path than all other frequencies. Such energy will appear in amplified form at the collector of transistor 10 across a load consisting of tunable circuit 34.

Tunable circuit 34, although not tuned to the frequency of the incoming signal, will always be tuned to a frequency which is relatively close to the frequency of the received signal, differing therefrom only by the fixed intermediate frequency. Use of tunable circuit 34 as the load impedance of transistor 10 will of course, decrease the gain of the radio frequency amplifier vis-a-vis use of a tunable circuit which is always tuned to the radio frequency being received. However since the incoming and oscillator frequencies are relatively close, the frequency of the received radio energy will still always fall within the pass band of tunable circuit 34, and thus the advantages of a tunable circuit will be obtained. Since circuit 34 also doubles as a tuned circuit for the oscillator-mixer stage, the disadvantage of loss of gain in the radio frequency amplifier stage will be more than offset by obviation of the aforediscussed disadvantages concomitant to the alternatives of a broadband load or four tunable circuits. Tuned circuit 34 is particularly suitable for use in standard band automobile radios where the intermediate frequency used is relatively low (262.5 kc.).

The circuit including transistor 12 is a Colpitts local oscillator and mixer. The circuit oscillates at the frequency to which circuit 34 is tuned because of energy fed back from the emitter, through the tuned circuit 34 and capacitor 42, to the base. The radio frequency energy amplified in transistor 10 is also coupled to the base of transistor 12 by capacitor 42 and is mixed with the local oscillator frequency energy in transistor 12. The difference or intermediate frequency, which will always be constant, is recovered in tank 46 to be further amplified in intermediate frequency amplifying stages (not shown). Thereafter the audio or modulating signal may be recovered by a detector and then amplified and fed to a loudspeaker according to standard practice.

FIG. 2.—RECEIVER CIRCUIT WITH TRANSFORMER COUPLED LOCAL OSCILLATOR

*Description*

The operation of the circuit of FIG. 2 is generally similar to that of FIG. 1; thus only the differences between the two circuits will be described. This circuit includes a transformer feedback oscillator and an image trap in place of the Colpitts oscillator of FIG. 1. Those elements in FIG. 2 corresponding to like elements in FIG. 1 have been identified with like reference numerals. Also in FIG. 2 the antenna and input circuitry for transistor 10 has been omitted since it is identical to FIG. 1.

The collector of transistor 10 is coupled to ground via autotransformer 62 and resistor 63. Auto transformer 62 provides a DC load path for the collector; it is tapped at 64 to provide the proper input level for the base of transistor 12. The base of transistor 12 is coupled to point 64 via the secondary of an adjustable inductance feedback transformer 54 and a variable capacitor 66. One side of capacitor 66 is coupled to ground via capacitor 68, and one side of the secondary of transformer 54 is coupled to ground via capacitor 70. Capacitor 72 is paralleled with the series-connected secondary of transformer 54 and capacitor 66. Transformer 54 is connected to ganging means 48.

The values of the capacitors and the inductance L of transformer 54 are chosen so that transformer 54 and capacitors 66 and 72 are resonant at the image frequency, i.e., $$f_{\text{image}}=\frac{1}{2\pi\sqrt{\dfrac{LC_{66}C_{72}}{C_{66}+C_{72}}}}$$

while transformer 54 and capacitors 66, 68, 70, and 72 are resonant at the oscillator frequencies, i.e., $$\frac{1}{2\pi\sqrt{LC_T}}=f_{\text{osc}}$$

where $$\frac{1}{C_t}=\frac{1}{C_{66}}+\frac{1}{C_{72}+\left(\dfrac{1}{C_{68}}+\dfrac{1}{C_{70}}\right)}$$

(As is well known, the image frequency signal is a spurious radio frequency signal which, when beat with the local oscillator signal, also provides the intermediate frequency.)

*Operation*

Amplified radio frequency energy at the collector of transistor 10 is applied to autotransformer 62 which acts as a broadband, high impedance load for alternating currents while providing a low impedance load for direct currents present at the collector. The AC load for the collector consists of broadband autotransformer 64 cascaded by a tuned circuit composed of transformer 54, and capacitors 66, 68, 72, and 70 which are resonant at the oscillator frequency, as in FIG. 1. This tuned circuit also doubles as the resonant circuit for the local oscillator since it is in the feedback path from the collector to the base of transistor 12.

A further feature of this embodiment of the invention is the image trap provided by transformer 54 and capacitors 66 and 72. The antenna tuned circuits sometimes cannot adequately suppress the image signal, and image frequencies may actually be generated due to non-linearities in the radio frequency amplifier. The image trap effectively eliminates these image frequencies by providing a large impedance to the image signal between point 64 and the base of transistor 12.

While the invention has been described with reference to the preferred embodiments thereof, it will be apparent that various modifications and other embodiments thereof will occur to those skilled in the art within the scope of the invention. Accordingly we desire that the scope of our invention be limited only by the appended claims.

We claim:

1. A radio frequency amplifier and oscillator-mixer for amplifying received radio frequency energy and converting the same into energy of an intermediate frequency by mixing therewith local oscillations, comprising:

(a) a first transistor circuit arranged to amplify radio frequency signals applied to an input circuit thereof, said transistor circuit having connected in an output circuit thereof a tunable load comprising a variable inductor paralleled by two series-connected capacitors, said tunable load being arranged to resonate at the frequency of said local oscillations, and (b) a second transistor circuit arranged to provide local oscillations and mix amplified radio frequency energy received from said first transistor circuit with said local oscillations, an input terminal and a feedback output terminal of said second transistor being connected across one of said two series-connected capacitors.

2. A radio frequency amplifier and oscillator-mixer for amplifying received radio frequency energy and converting the same into energy of an intermediate frequency by mixing therewith local oscillations, comprising:

(a) a first transistor arranged to amplify radio frequency signals applied to an input circuit thereof, said transistor having connected in an output circuit thereof a tunable load impedance comprising one winding of a variable inductance transformer which winding is connected in series with a first capacitor, the series-connected winding and first capacitor being paralled by a second capacitor, third and fourth capacitors connected between the respective end terminals of said second capacitor and points of reference potential, said transformer, said first capacitor, and said third and fourth capacitors arranged to resonate at the frequency of said local oscillations, and (b) a second transistor arranged to provide local oscillations and mix amplified radio frequency energy from said first transistor with said local oscillations, a feedback output terminal of said second transistor being connected to the other winding of said transformer.

3. A radio frequency amplifier and oscillator-mixer for amplifying received radio frequency energy and converting the same into energy of an intermediate frequency by mixing therewith local oscillations, comprising:

(a) a first transistor circuit arranged to amplify radio frequency signals applied to an input thereof, said transistor having connected in an output circuit thereof a tunable load impedance including one winding having connected in series therewith a first capacitor, a second capacitor connected in parallel with the series-connected winding and first capacitor, third and fourth capacitors connecting respective non-common terminals of said series-connected first capacitor and winding to reference potential, said first, third, and fourth capacitors and said transformer arranged to resonate at the frequency of said local oscillations, and said first and second capacitors and said transformer arranged to resonate at the image of said radio frequency, and (b) a second transistor circuit arranged to provide local oscillations and mix amplified radio frequency energy from said first transistor with said local oscillations, a feedback output terminal of said second transistor being connected to reference potential via another winding of said transformer.

4. A front end for a transistorized receiver, comprisprising, in combination:

(a) an antenna and a tunable circuit coupled thereto for selecting from the signals intercepted by said antenna a signal of a particular radio frequency, (b) a radio frequency amplifier stage arranged to receive said radio frequency signal from said tunable circuit, said amplifier stage including a transistor, and a bias potential source, the emitter of said transistor being connected to one terminal of said source, and a tunable load impedance comprising an inductor paralleled by two series-connected capacitors, said tunable load impedance being connected in circuit between the collector of said transistor and the other terminal of said source, being resonant at a frequency different from said radio frequency by an intermediate frequency, and being tunable synchronously with said tunable circuit, (c) a converter stage for generating a local oscillator signal and heterodyning the radio frequency output signal from said radio frequency stage therewith to generate an intermediate frequency signal, said converter stage including a second transistor having a feedback circuit connected from the emitter to the base thereof via one of said two capacitors so that said stage will oscillate at the resonant frequency of said tunable load impedance, the collector circuit of said second transistor including a load impedance circuit tuned to said intermediate frequency for developing an intermediate frequency output signal thereacross.

5. In combination:

(a) a first transistor circuit arranged to amplify a radio frequency signal, (b) a second transistor circuit arranged to provide a local oscillator signal and heterodyne therewith the amplified radio frequency signal supplied by said first transistor circuit, said second transistor circuit including a signal feedback circuit for providing said local oscillations, said feedback circuit including a transformer circuit tuned to the frequency of said local oscillator signal, said tuned transformer circuit also serving as an output load impedance for said first transistor circuit, one winding of said transformer having a first capacitor in series therewith, said series-connected transformer winding and said first capacitor being paralleled by a second capacitor.

References Cited

UNITED STATES PATENTS

| | | | |
|---|---|---|---|
| 2,695,952 | 11/1954 | Barton | 325—440 X |
| 3,165,700 | 1/1965 | Birkenes | 325—440 |

KATHLEEN H. CLAFFY, *Primary Examiner.*

WILLIAM C. COOPER, *Examiner.*

R. S. BELL, *Assistant Examiner.*